United States Patent
Bergendahl et al.

(10) Patent No.: US 8,941,179 B2
(45) Date of Patent: Jan. 27, 2015

(54) FINFETS AND FIN ISOLATION STRUCTURES

(71) Applicant: International Business Machines Corporation, Armonk, NY (US)

(72) Inventors: Marc A. Bergendahl, Hopewell Junction, NY (US); David V. Horak, Essex Junction, VT (US); Charles W. Koburger, III, Delmar, NY (US); Shom Ponoth, Gaithersburg, MD (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/265,401

(22) Filed: Apr. 30, 2014

(65) Prior Publication Data

US 2014/0231918 A1    Aug. 21, 2014

Related U.S. Application Data

(62) Division of application No. 13/771,240, filed on Feb. 20, 2013, now Pat. No. 8,785,284.

(51) Int. Cl.
*H01L 27/12*    (2006.01)
*H01L 29/06*    (2006.01)
*H01L 21/762*    (2006.01)

(52) U.S. Cl.
CPC ...... *H01L 29/0653* (2013.01); *H01L 21/76205* (2013.01); *H01L 27/1211* (2013.01)
USPC ...................................................... 257/347

(58) Field of Classification Search
USPC ...................................................... 257/347
See application file for complete search history.

(56) References Cited

U.S. PATENT DOCUMENTS

| | | | |
|---|---|---|---|
| 6,720,619 B1 | 4/2004 | Chen et al. | |
| 6,933,183 B2 | 8/2005 | Beintner et al. | |
| 7,211,864 B2 * | 5/2007 | Seliskar | 257/347 |
| 7,291,886 B2 | 11/2007 | Doris et al. | |
| 7,352,037 B2 | 4/2008 | Kim et al. | |
| 7,470,570 B2 | 12/2008 | Beintner et al. | |

(Continued)

OTHER PUBLICATIONS

R.-H. Yan et al., "Scaling the Si MOSFET: from bulk to SOI to bulk," IEEE Transactions on Electron Devices, vol. 39, Issue 7, Jul. 1992, pp. 1704-1710.

(Continued)

*Primary Examiner* — Yu-Hsi D Sun
*Assistant Examiner* — Grant Withers
(74) *Attorney, Agent, or Firm* — Steven Meyers; Roberts Mlotkowski Safran & Cole, P.C.

(57) ABSTRACT

FinFETs and fin isolation structures and methods of manufacturing the same are disclosed. The method includes patterning a bulk substrate to form a plurality of fin structures of a first dimension and of a second dimension. The method includes forming oxide material in spaces between the plurality of fin structures of the first dimension and the second dimension. The method includes forming a capping material over sidewalls of selected ones of the fin structures of the first dimension and the second dimension. The method includes recessing the oxide material to expose the bulk substrate on sidewalls below the capping material. The method includes performing an oxidation process to form silicon on insulation fin structures and bulk fin structures with gating. The method further includes forming a gate structure over the SOI fin structures and the bulk fin structures.

9 Claims, 6 Drawing Sheets

(56) References Cited

U.S. PATENT DOCUMENTS

| | | | |
|---|---|---|---|
| 7,812,373 B2 | 10/2010 | Bauer et al. | |
| 7,855,105 B1 | 12/2010 | Jagannathan et al. | |
| 7,888,201 B2 | 2/2011 | Yeo et al. | |
| 8,008,751 B2 * | 8/2011 | Irisawa et al. | 257/627 |
| 8,227,304 B2 | 7/2012 | Iyer et al. | |
| 8,298,913 B2 | 10/2012 | Anderson et al. | |
| 2008/0050866 A1 | 2/2008 | Booth et al. | |
| 2008/0111185 A1* | 5/2008 | Cheng | 257/347 |
| 2010/0044794 A1* | 2/2010 | Cheng | 257/347 |
| 2010/0200933 A1 | 8/2010 | Kahng et al. | |
| 2010/0264468 A1* | 10/2010 | Xu | 257/288 |
| 2010/0308409 A1* | 12/2010 | Johnson et al. | 257/368 |
| 2011/0198676 A1 | 8/2011 | Luo et al. | |
| 2012/0199918 A1 | 8/2012 | Pham | |
| 2012/0235247 A1* | 9/2012 | Cai et al. | 257/392 |
| 2013/0134513 A1 | 5/2013 | Standaert et al. | |
| 2013/0143409 A1 | 6/2013 | Johnson | |
| 2013/0309838 A1 | 11/2013 | Wei et al. | |
| 2013/0313649 A1 | 11/2013 | Basker et al. | |
| 2013/0316513 A1 | 11/2013 | Basker et al. | |

OTHER PUBLICATIONS

M. Mendez et al., "Comparing SOI and bulk FinFETs: Performance, manufacturing variability, and cost," Solid State Technology, vol. 52, No. 11, Nov. 2009, pp. 10,12-15.

International Search Report and Written Opinion for related PCT Application No. PCT/US13/73336 dated Apr. 9, 2014, 11 pages.

* cited by examiner

US 8,941,179 B2

FINFETS AND FIN ISOLATION STRUCTURES

FIELD OF THE INVENTION

The invention relates to semiconductor structures and, more particularly, to finFETs and fin isolation structures and methods of manufacturing the same.

BACKGROUND

Silicon on insulator (SOI) substrates can be used in place of conventional silicon BULK substrates in semiconductor manufacturing. These SOI wafers provide many advantages in microelectronics such as the reduction of parasitic device capacitance, which results in improved device performance. SOI-based devices differ from conventional silicon-built devices in that the silicon junction is above an electrical insulator, typically silicon dioxide. The insulating layer and topmost silicon layer also vary widely with application. SOI substrates are very expensive to use in the manufacturing of semiconductor devices.

SUMMARY

In one or more embodiments of the invention, a method comprises patterning a bulk substrate to form a plurality of fin structures of a first dimension and a plurality of fin structures of a second dimension. The method further comprises forming oxide material in spaces formed between the plurality of fin structures of the first dimension and the plurality of fin structures of the second dimension. The method further comprises forming a capping material over sidewalls of selected ones of the plurality of fin structures of the first dimension and the plurality of fin structures of the second dimension. The method further comprises recessing the oxide material to expose the bulk substrate on sidewalls below the capping material. The method further comprises performing an oxidation process to form silicon on insulation (SOI) fin structures from the selected ones of the plurality of fin structures of the first dimension, and bulk fin structures with gating from the selected ones of the plurality of fin structures of the second dimension. The method further comprises forming a gate structure over the SOI fin structures and the bulk fin structures.

In one or more embodiments of the invention, a method comprises patterning a bulk substrate and a cap layer to form a plurality of narrow fins and a plurality of wide fins. The method further comprises depositing oxide material within spaces between the plurality of narrow fins and the plurality of wide fins. The method further comprises depositing a capping material over sidewalls the plurality of narrow fins and the plurality of wide fins. The method further comprises removing the capping material on the sidewalls of selected ones of the plurality of narrow fins and the plurality of wide fins. The method further comprises recessing the oxide material to below the capping material to expose the bulk substrate. The method further comprises performing an oxidation process on exposed portions of the bulk substrate which forms: one or more substrate on insulator fin structures; one or more bulk substrate fin structures; and one or more insulator structures.

In one or more embodiments of the invention, a structure comprises a plurality of finFETs of a first dimension comprising a bulk substrate and an oxidized layer of the bulk substrate. The structure further comprises a plurality of insulator fins comprising an oxidized layer of the bulk substrate extending along or substantially along its entire length. The structure further comprises a plurality of bulk finFETs of a second dimension larger than the first dimension. The plurality of bulk finFETs are formed from the bulk substrate, with oxidized sidewalls formed therein.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the finFET structures, which comprises the structures of the present invention. In still further embodiments, a method in a computer-aided design system is provided for generating a functional design model of the finFET structures. The method comprises generating a functional representation of the structural elements of the finFET structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to finFETs and fin isolation structures and methods of manufacturing the same. Advantageously, by using the process flows of the present invention it is now possible to gain benefits of SOI, without using an SOI wafer as the base substrate. This, in turn, significantly reduces manufacturing costs. Also, advantageously, the present invention provides benefits to large width structures, and particularly, large width finFETs. For example, these benefits include different $V_t$ and continuous control of "gate width".

More specifically, the present invention provides process flows to form SOI (silicon-on-insulation) like finFETs entirely from a BULK wafer. The process flow also enables a fabrication process to form BULK finFETs. Moreover, the present invention provides SOI-like processing to isolate fins from each other, by forming isolation structures during the formation of the finFETs. In addition, the present invention enables the manufacture of finFET structures which have much lower aspect ratios than conventional structures.

Figure 1:
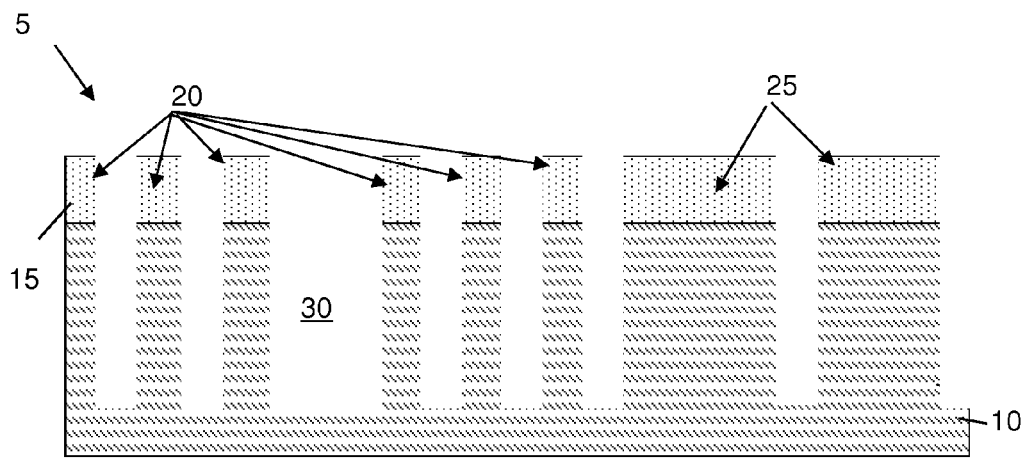
FIGS. 1, 2, 3, 4a, 4b, 5, 6 and 7 show structures and respective processing steps in accordance with aspects of the present invention.

FIG. 1 shows a starting structure and respective processing steps in accordance with aspects of the present invention. In particular, the structure 5 includes a BULK wafer 10 and a cap layer 15. In embodiments, the BULK wafer 10 is a Si BULK wafer and the cap layer 15 is a nitride cap material. In embodiments, the cap layer 15 can be deposited on the wafer 10 using conventional chemical vapor deposition (CVD) processes, known to those of ordinary skill in the art. In embodiments, the thickness of the cap layer 15 can be any dimension sufficient to survive subsequent processes steps. For example, in embodiments, the thickness of the cap layer 15 can be about 40 nm-50 nm; although other dimensions are also contemplated by those of skill in the art.

The structure 5 of FIG. 1 further includes narrow fin structures 20 and wide fin structures 25, formed using lithography and etching techniques as further discussed herein. The narrow fin structures 20 can range from about 2 nm-20 nm in width, with a preference of about 8 nm; whereas, the wide fin structures 25 can be about 30 nm and above in width, with a preference of any dimension above 30 nm. In more specific embodiments, the wide fin structures 25 will be of sufficient width to prevent portions of the wide fin structures 25 from being fully oxidized during subsequent processing steps. In embodiments, spacing 30 between the narrow fin structures 20 and wide fin structures 25 can vary in pitch. For example, the present invention contemplates a split pitch pattern, which requires two masking processes.

In embodiments, the narrow fin structures 20 and the wide fin structures 25 are used to form SOI-like finFETs, BULK finFETs and isolation structures. These narrow fin structures 20 and the wide fin structures 25 can be formed using lithography and etching techniques. By way of non-limiting example, the narrow fin structures 20 and wide fin structures 25 can be formed using conventional direct lithography processes, known to those of ordinary skill in the art. Also, one of skill in the art would recognize that the narrow fin structures 20 and wide fin structures 25 can be formed using sidewall image transfer (SIT) techniques or a SIT-squared technique or variations thereof to pattern lithographic and sub-lithographic features and the spacing 30 therebetween.

In the SIT technique, for example, a mandrel is formed on the cap layer 15, using conventional deposition, lithography and etching processes. In a SIT-squared technique, two mandrels can be used, one set of mandrels formed on top of an offset from another set of mandrels. In an example of a SIT technique, a mandrel material, e.g., $SiO_2$, is deposited on the cap layer 15 using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the narrow fin structures 20 and/or wide fin structures 25. (A SIT squared technique can be used to form different spacings between adjacent narrow fin structures.) Spacers are formed on the sidewalls of the mandrels which are preferably material that is different than the mandrels, and which are formed using conventional deposition processes known to those of skill in the art. The spacers can have a width which matches the dimensions of the narrow fin structures 20, for example. The mandrels are removed or stripped using a conventional etching process, selective to the mandrel material. An etching is then performed within the spacing of the spacers to form the sub-lithographic features. The sidewall spacers can then be stripped. In embodiments, the wide fin structures can also be formed during this or other patterning processes, or through other conventional patterning processes, as contemplated by the present invention.

Figure 2:
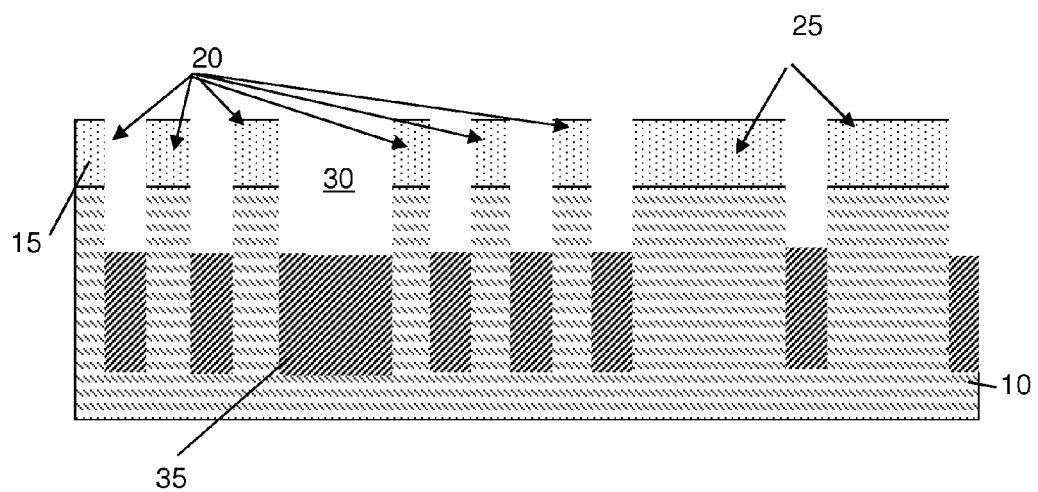

In FIG. 2, oxide material 35 is deposited within the spaces 30 between the narrow fin structures 20 and wide fin structures 25 to form isolation fill. The oxide material 35 is deposited using conventional deposition processes, e.g., CVD or other processes leading to no voids as should be understood by those of ordinary skill in the art. Any oxide material 35 formed on the narrow fin structures 20 and wide fin structures 25 during the deposition process can be removed using conventional chemical mechanical polishing (CMP). After the deposition and polishing processes, the oxide material 35 formed within the spaces can be recessed to below the cap layer 15 by about 25 nm-35 nm; although other dimensions are also contemplated by the present invention.

Figure 3:
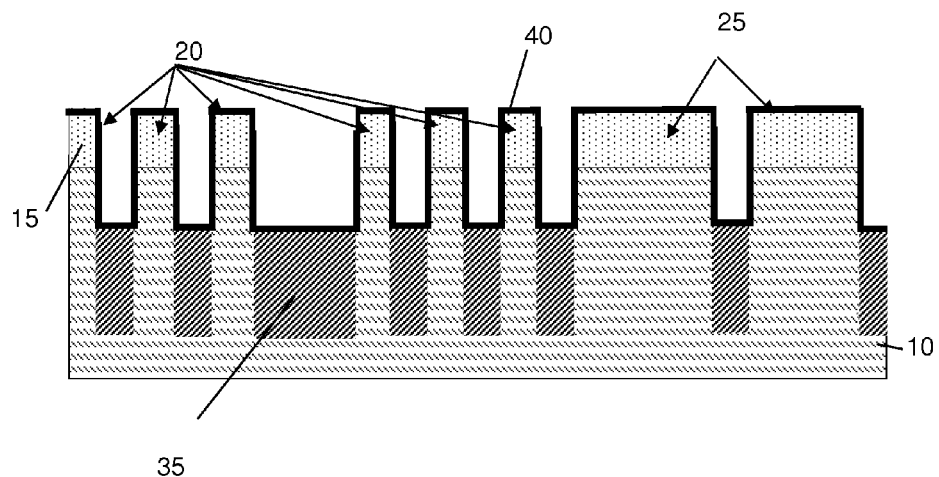

In FIG. 3, a capping material 40 is deposited on the exposed surfaces of the cap layer 25, the BULK material 10 and the oxide material 35. That is, the capping material 40 is formed over exposed portions of the narrow fin structures 20 and the wide fin structures 25, in addition to the oxide material 35 therebetween. In embodiments, the capping material 40 is a nitride material, which is deposited using a conventional CVD process. In embodiments, the cap material 40 is deposited to a thickness of about 30 Å to 40 Å; although other dimensions are also contemplated by the present invention. In embodiments, the deposition process is a conformal deposition process. Additionally, it should also be understood that the thickness of about 30 Å to 40 Å prevents oxidation of the silicon during subsequent processes.

Figure 4A:
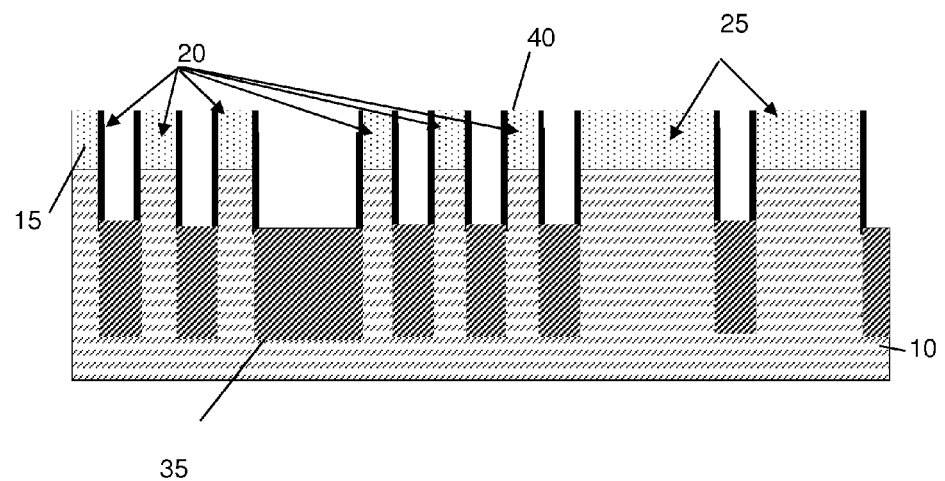
Figure 4B:
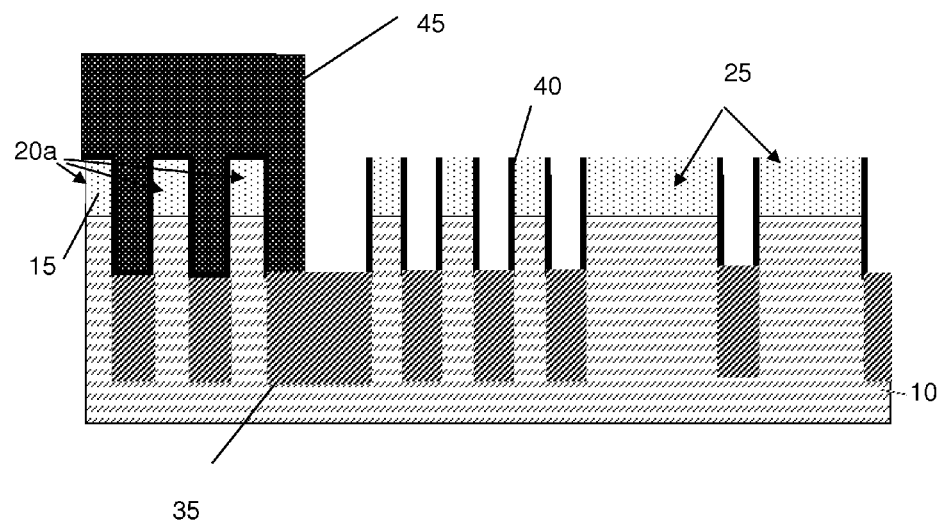

FIGS. 4a and 4b show additional structures and respective processing steps in accordance with aspects of the present invention. In FIG. 4a, horizontal portions of the capping material 40 are etched using an isotropic etching process. In this etching process, the vertical surfaces of the capping material 40 remain on the sidewalls of the narrow fin structures 20 and the wide fin structures 25. That is, the capping material 40 will be etched away over the oxide material 35, which can then be used in subsequent oxidation processes to form SOI-like fins and isolation structures.

FIG. 4b shows another portion of the structure, with portions 20a of the narrow fin structures 20 and respective oxide material 35 being blocked by a resist material 45 during the etching process shown and described with reference to FIG. 4a. In this way, during the isotropic etching shown in FIG. 4a, the resist material 45 will prevent portions of the capping material 40 from being etched or removed over the oxide material 35 thereby making it possible to build a BULK finFET device during subsequent processing steps. More specifically, as will be understood by those of skill in the art, in view of subsequent processing steps, the capping material 40 will prevent oxidation processes from occurring on the blocked portions 20a of the narrow fin structures 20.

Figure 5:
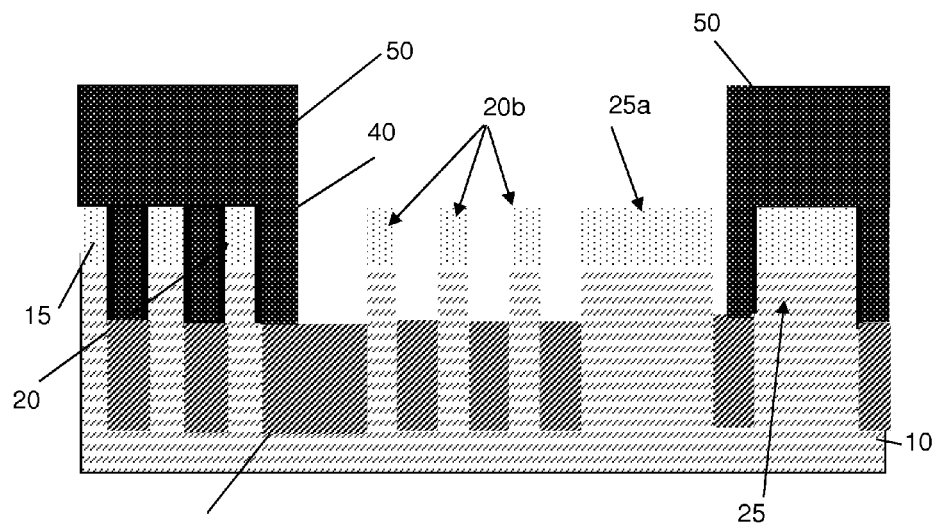

Following the processes in FIG. 4a, FIG. 5 shows a finFET isolation mask 50 formed over narrow fin structures 20 and at least one wide fin structure 25. This results in the BULK wafer material 10 of narrow fin structures 20b and at least one wide fin structure 25a being exposed during subsequent processing steps. In this way, by using the finFET isolation mask 50, the capping material 40 can be removed from the narrow fin structures 20b and at least one wide fin structure 25a, using a conventional nitride etching processes.

Figure 6:
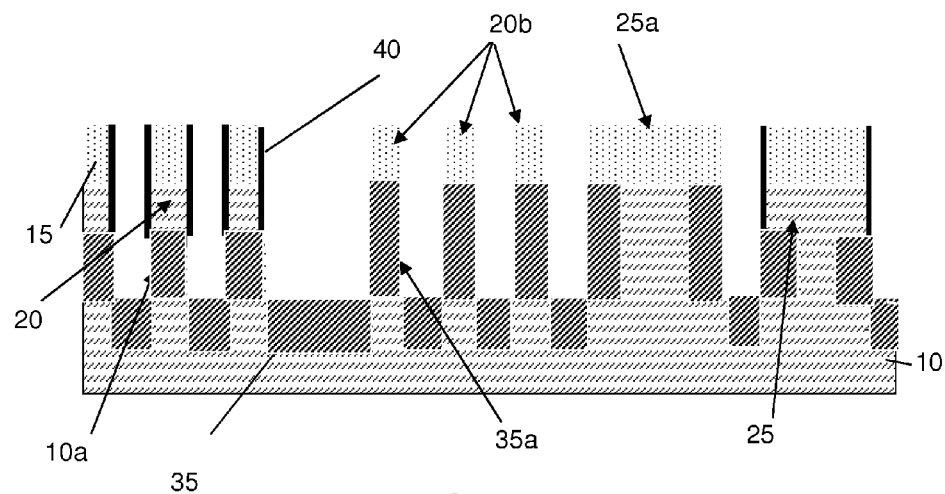

In FIG. 6, the finFET isolation mask 50 is removed using a conventional oxygen ashing process, for example. The oxide material 35 is then further recessed, to exposed portions 10a of the BULK material 10 on the narrow fin structures 20 and the wide fin structure 25 (below the capping material 40). The exposed portions 10a of the BULK wafer 10 then undergo an oxidation process, using the oxide material 35. For example, the processes may be performed in a wet hydrogen or oxygen furnace at 900° C. at 50 minutes, as one non-limiting illustrative example. During this oxidation process, oxide material will be formed through the entirety of the exposed portions of the narrow fin structures 20, 20b, e.g., the exposed BULK material will be completely oxidized to form an insulation layer 35a on the narrow fin structures 20, 20b. In embodiments, the oxidized portion of the narrow fin structures 20b will extend along or substantially along its entire length. The capping material 40, though, will protect the BULK material 10 from oxidizing above the now formed insulator layer 35a. In this way, SOI-like fin structures can be formed.

In an optional embodiment, still referring to FIG. 6, the finFET isolation mask 50 can be removed using a conventional oxygen ashing process, for example. Additional oxide material can then formed within the spaces, using for example, conventional deposition processes. This additional oxide material will stabilize the fins during subsequent oxidation process, using the oxide material 35 as described already above.

In embodiments, the oxide material will also be formed completely on the exposed BULK material 10 of the narrow fin structures 20b resulting in isolation structures. Note that the narrow fin structures do not have any Si material at the tops thereof, in contrast to the narrow fin structures 20. With this difference, the narrow fin structures 20b will be formed into the isolation structures and the narrow fin structures 20 will be formed into SOI-like fin structures. One of skill in the art should realize that the fin structures 25, 25a are of such a width that the oxide material will not form completely therethrough.

It should also be understood by those of skill in the art that protected portions 20a of the narrow fin structures 20 shown in FIG. 4b will not undergo any oxidation process, as the capping material 40 will prevent such processes from occurring. In this way, narrow BULK finFET devices can be formed during the same processing steps as the SOI like finFETs.

Figure 7:
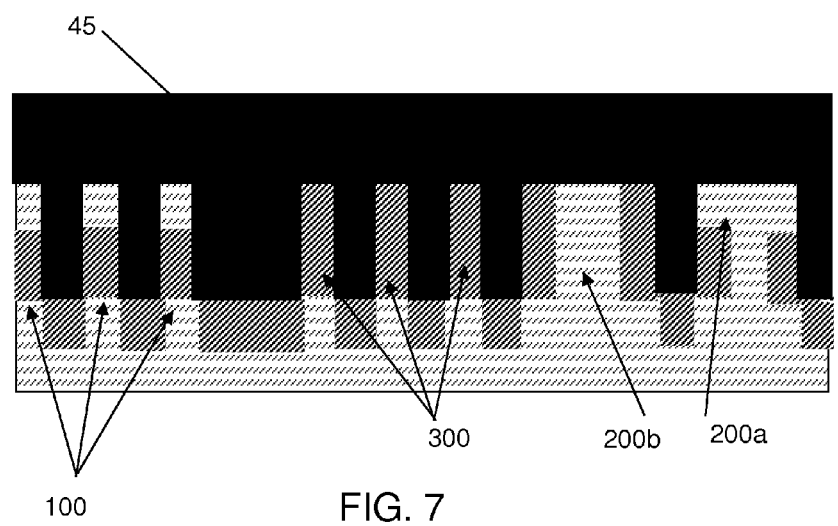

In FIG. 7, the cap layer 25 and the remaining capping material 40 can be removed using conventional nitride stripping techniques. A gate material 45, e.g., metal or polysilicon, is then be formed over the finFET structures and oxide material. The gate structure can be formed by a conventional deposition and patterning process, e.g., CVD, lithography and reactive ion etching (RIE). In this way, it is possible to form sublithographic SOI-like finFET devices 100 (comprising silicon and oxide material) and BULK devices 200a and 200b (with oxide sidewalls), separated by isolation structures 300, during same gating processes. In embodiments, the BULK devices 200a and 200b can either be a BULK tri-gate 200a, e.g., have gating on three sides extending partially along the sidewall (below the capping material), or a BULK gate 200b with gating on the top of the structure, e.g., extending along a full length of the sidewall. It should be understood by those of skill in the art that the SOI-like finFET devices 100 and BULK devices 200 undergo additional processes such as, for example, conventional doping or implantation processes to form source and drain regions, and other CMOS fabrication processes, e.g., annealing processes and contact formation.

Figure 8:
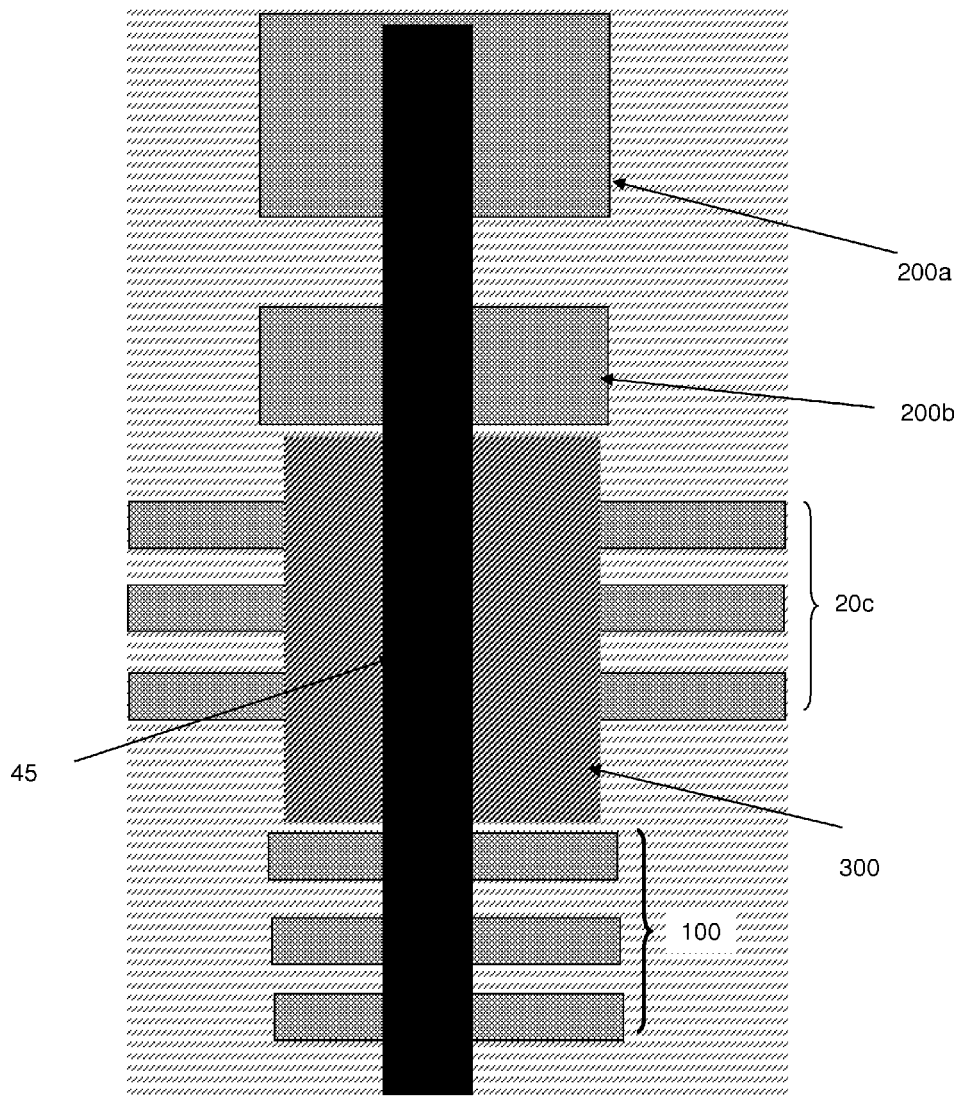
FIG. 8 shows a top view of a structure shown in FIG. 7.

FIG. 8 shows a top view of FIG. 7. As shown in FIG. 8, the gate material 45 spans over sub-lithographic SOI-like finFET devices 100, BULK devices 200 and isolation structures 300.

Figure 9:
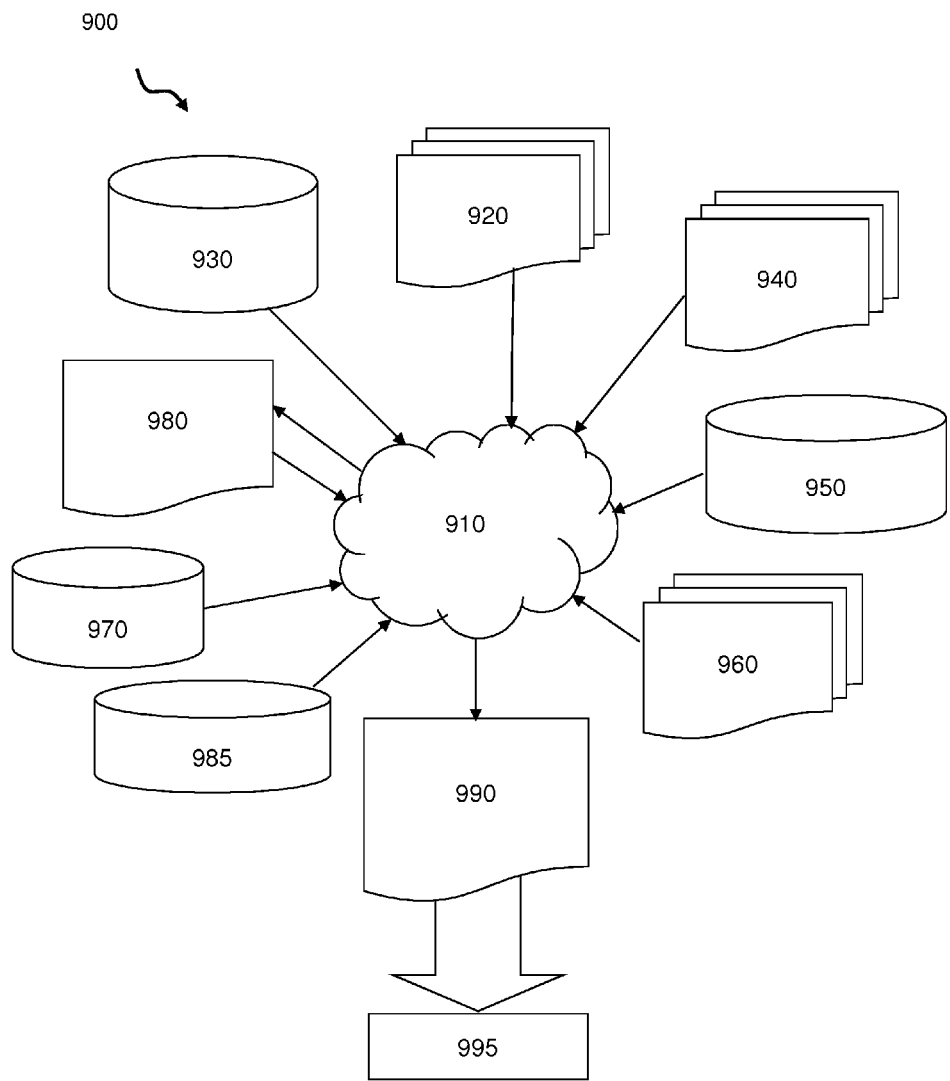
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2, 3, 4a, 4b, 5, 6, 7 and 8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, 3, 4a, 4b, 5, 6, 7 and 8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2, 3, 4a, 4b, 5, 6, 7 and 8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 3, 4a, 4b, 5, 6, 7 and 8. In one embodiment, design structure 990 may comprise a compiled, executable HDL simulation model that functionally simulates the devices shown in FIGS. 1, 2, 3, 4a, 4b, 5, 6, 7 and 8.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 3, 4a, 4b, 5, 6, 7 and 8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a plurality of finFET's of a first dimension comprising a portion of a bulk substrate and an oxidized layer of the bulk substrate;
    a plurality of insulator fins comprising an oxidized layer of the bulk substrate extending along or substantially along the entire length of the plurality of insulator fins; and
    a plurality of bulk finFETs of a second dimension larger than the first dimension, the plurality of bulk finFETs formed from the bulk substrate, with oxidized sidewalls formed therein.

2. The structure of claim 1, wherein the plurality of finFETs of the first dimension are completely oxidized below the portion of the bulk substrate.

3. The structure of claim 1, wherein the plurality of bulk finFETs of the second dimension are partially oxidized.

4. The structure of claim 1, further comprising a capping material over sidewalls of selected ones of the plurality of finFETs of the first dimension and selected ones of the plurality of bulk finFETs of the second dimension.

5. The structure of claim 4, wherein the plurality of finFETs of the first dimension are oxidized below the capping material.

6. The structure of claim 4, wherein the first dimension is smaller than the second dimension, in width.

7. The structure of claim 6, wherein:
    the first dimension is of a width that allows an oxidation process to completely oxidize an exposed portion of the bulk substrate on sidewalls below the capping material; and
    the second dimension is of a width that allows partial oxidation of the exposed portion of the bulk substrate on sidewalls below the capping material.

8. The structure of claim 4, wherein the capping material is nitride.

9. The structure of claim 1, wherein the second dimension is of such a width that oxidation forms only on sidewalls of the plurality of bulk finFETs.

\* \* \* \* \*